(12) United States Patent
Knapp (10) Patent No.: US 8,928,102 B2
(45) Date of Patent: Jan. 6, 2015

(54) PERFORMANCE OPTICALLY COATED SEMICONDUCTOR DEVICES AND RELATED METHODS OF MANUFACTURE

(71) Applicant: Jamie Knapp, Mendon, MA (US)

(72) Inventor: Jamie Knapp, Mendon, MA (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 13/861,875

(22) Filed: Apr. 12, 2013

(65) Prior Publication Data

US 2013/0221467 A1 Aug. 29, 2013

Related U.S. Application Data

(63) Continuation of application No. 12/741,580, filed as application No. PCT/US2008/013653 on Dec. 11, 2008, now Pat. No. 8,445,299.

(60) Provisional application No. 61/007,494, filed on Dec. 12, 2007.

(51) Int. Cl.
| | |
|---|---|
| *H01L 31/0232* | (2014.01) |
| *H01L 33/44* | (2010.01) |
| *H01L 27/146* | (2006.01) |
| *H01L 31/0216* | (2014.01) |
| *G02B 5/28* | (2006.01) |

(52) U.S. Cl.
CPC .... *H01L 31/02327* (2013.01); *H01L 27/14621* (2013.01); *H01L 31/02165* (2013.01); *G02B 5/285* (2013.01)
USPC ...... 257/432; 257/96; 257/428; 257/E31.127; 257/E33.061; 257/E33.067

(58) Field of Classification Search
USPC .................... 257/98, 432, E31.127, E33.067, 257/E33.061
See application file for complete search history.

(56) References Cited

U.S. PATENT DOCUMENTS

| | | | |
|---|---|---|---|
| 5,812,580 A * | 9/1998 | Nabiev et al. | 372/49.01 |
| 2006/0192111 A1 * | 8/2006 | Fuhrer et al. | 250/288 |

* cited by examiner

*Primary Examiner* — Mamadou Diallo
(74) *Attorney, Agent, or Firm* — Brian F. Swienton (57) ABSTRACT

The present application disclosed various embodiments of improved performance optically coated semiconductor devices and the methods for the manufacture thereof and includes at least one semiconductor wafer having at least a first surface, a first layer of low density, low index of refraction optical material applied to at least the first surface of the semiconductor wafer, and a multi-layer optical coating applied to the first layer of low density, low index of refraction material, the multi-layer optical coating comprising alternating layers of low density, low index of refraction materials and high density, high index of refraction materials.

9 Claims, 6 Drawing Sheets

PERFORMANCE OPTICALLY COATED SEMICONDUCTOR DEVICES AND RELATED METHODS OF MANUFACTURE

CROSS-REFERENCE TO RELATED APPLICATIONS

The present application claims priority to U.S. patent application Ser. No. 12/741,580, filed on May 5, 2010, which claims priority to Patent Cooperation Treaty Patent Application Ser. No. PCT/US08/13653, filed Dec. 11, 2008, which claims priority to U.S. Provisional Patent Application Ser. No. 61/007,494, filed Dec. 12, 2007, the entire contents of which is hereby incorporated by reference in its entirety herein.

BACKGROUND

Figure 1:
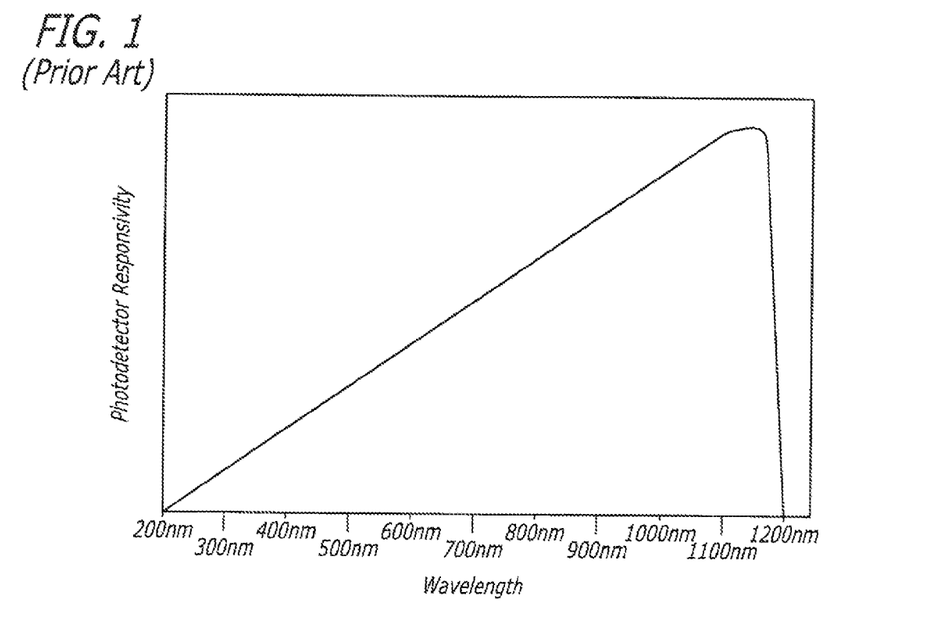
FIG. 1 shows a graph of the wavelength responsivity of a typical silicon-based photovoltaic detector.
Figure 2:
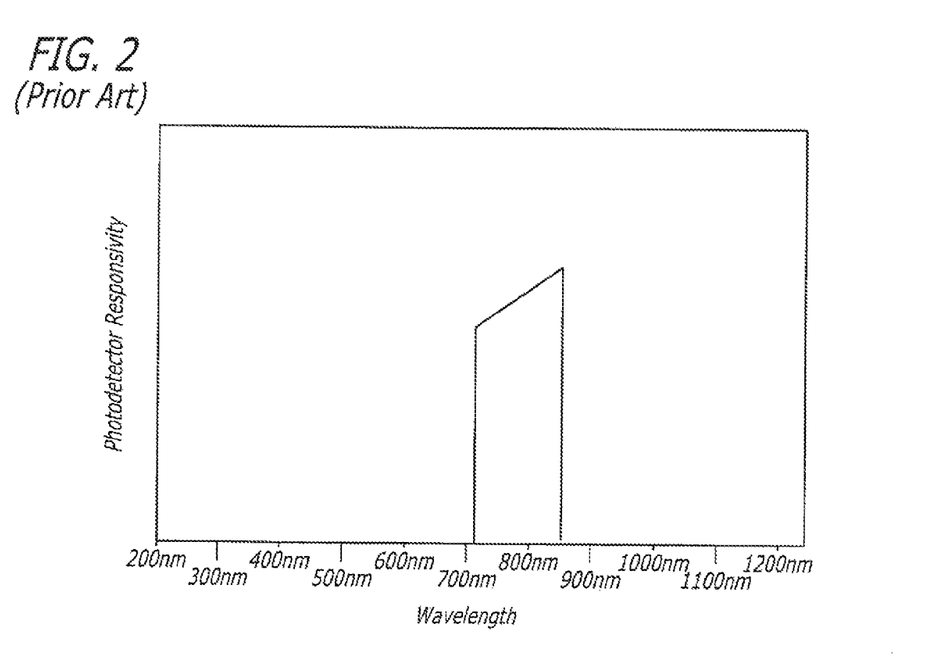
FIG. 2 shows a graph of the wavelength responsivity of the photovoltaic detector of FIG. 1 tuned or otherwise configured to selectively detect a narrow wavelength band of incident light from about 720 nm to about 820 nm.
Figure 3:
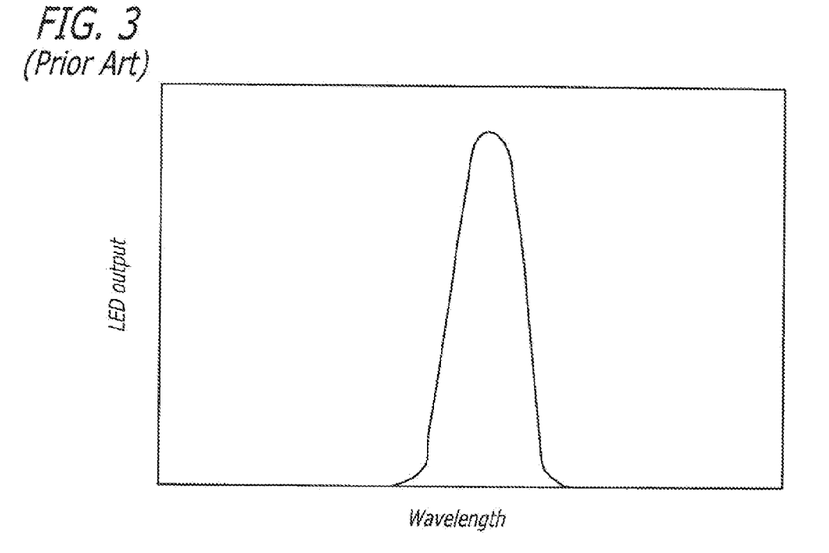
FIG. 3 shows a graph of the wavelength transmission of a typical silicon-based light emitting diode.
Figure 4:
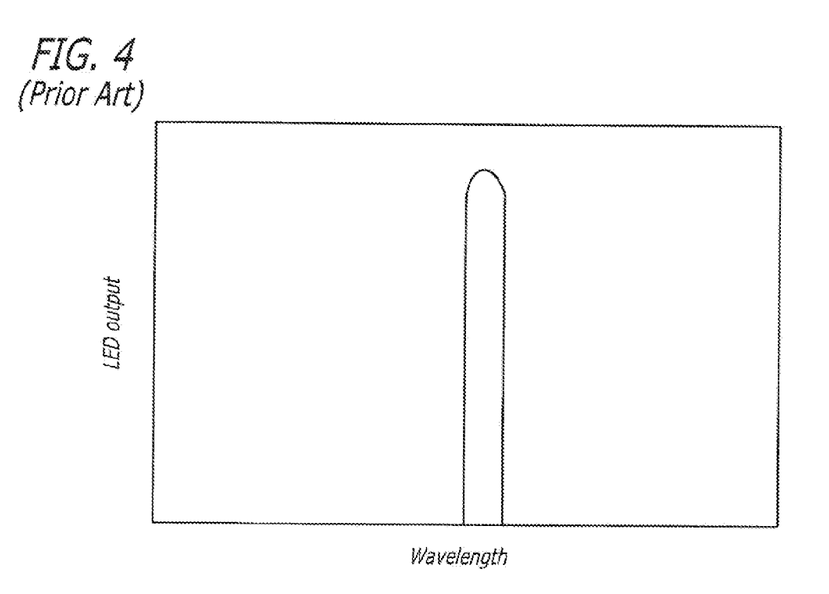
FIG. 4 shows a graph of the wavelength transmission of a typical silicon-based light emitting diode shown in FIG. 3 selectively tuned to output a narrow wavelength band of light.

Presently, there is ever-increasing demand for semiconductor optoelectronic devices having spectral performances tuned for many critical applications. For example, FIG. 1 graphically shows the responsivity of a typical silicon-based photovoltaic detector. As shown, the silicon-based photovoltaic detector has an approximately linear spectral responsivity from about 200 nm to about 1200 nm. In contrast, FIG. 2 shows the spectral responsivity of the same photovoltaic detector tuned or otherwise configured to selectively detect a narrow wavelength band of incident light from about 720 nm to about 820 nm In another example, FIG. 3 shows an example of the spectral output of a light emitting diode (LED). In contrast, FIG. 4 shows that the spectral output of the silicon-based LED shown in FIG. 3 may be tuned to output a more narrow spectral range. Presently, numerous applications demand precise spectral tuning of their optoelectronic components, including those used for high-precision biomedical fluorescence applications and/or other critical measurement-and-control applications.

Figure 5:
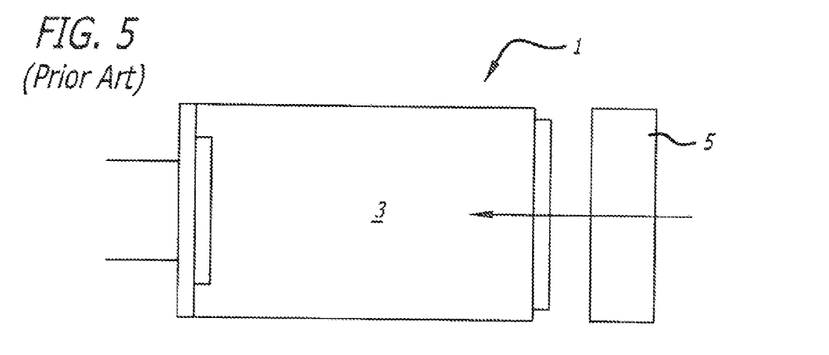
FIG. 5 shows a schematic of an embodiment of an optoelectronic device having an optically-coated glass component mounted external of a device body.
Figure 6:
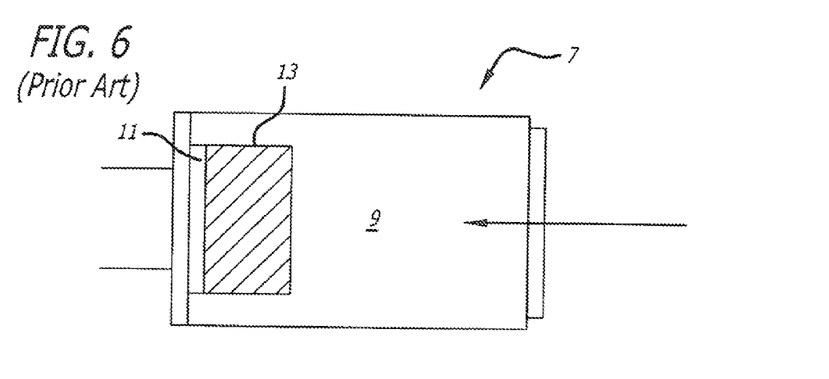
FIG. 6 shows a schematic of an embodiment of an optoelectronic device having an optically-coated glass component mounted within a device body.

Numerous methods have been attempted to produce spectrally tuned optoelectronic devices. For example, as shown in FIG. 5 one previous device incorporates an optically-coated glass component 5 mounted external of the housing 3 of the semiconductor device 1. Alternatively, FIG. 6 shows an embodiment of a device 7 having a detector device 11 positioned within a device housing 9. As shown, an optically coated glass filter device 13 is positioned within the housing 9 proximate to the detector device 11. Typical optically-coated glass devices consist of glass or glass-like optically transparent substrates (e.g. Schott Borofloat, BK-7, fused silica, etc) having at least one multilayer thin-film optical interference coating applied thereto. For example, often the multilayer optical interference coating comprises alternating layers of materials having a low index of refraction and a high index of refraction. While numerous methods exist for producing such optical thin-film coatings, relatively few coating processes achieve the film structure and density required for high-precision applications. For example, conventionally deposited optical thin films (e.g. thermal or electron-beam evaporated oxide-based materials such as SiO2, HfO2. Ta2O5, etc) have micro-morphologies which are columnar and porous, allowing the absorption and desorption of atmospheric moisture. As such, the effective index of refraction of the multi-layer thin film may change as a result of such moisture entrapment, which may result in spectral shifts and instabilities. For many critical instrument applications, this results in devastating losses of the optical precision. Alternative state-of-the-art optical coating processes therefore are geared towards densifying thin films as a means to prevent such moisture penetration. As such, the multilayer optical interference coating comprises alternating layers of low index and high index materials, wherein both the low and high index materials are high density materials. Such processes include reactive ion plating, ion-assisted electron-beam evaporation, ion-beam sputtering, magnetron sputtering, and plasma-enhanced CVD.

While current optical thin-film multilayer deposition technologies (e.g. ion plating, ion-beam sputtering, magnetron sputtering, ion-assisted electron beam deposition, CVD, etc.) satisfy the need for creating densified optical coatings, a number of shortcomings have identified. For example, these processes fail to provide the ideal configuration for use as directly deposited optical coatings upon semiconductor surfaces. More specifically, current deposition technologies produce densified optical coating films having undesirable excessive film stresses, which may deteriorate the performance of the device. In addition, these highly densified optical coating films are difficult, if not impossible, to further process (e.g. etch) once the coating is applied.

Therefore, in light of the foregoing, there is an ongoing need for a multilayer optical thin-film coating method capable of producing an optical coating on a semiconductor wafer device or material that is environmentally stable, but both minimizes harmful stresses, and allows for a simple, non-damaging and manufacturable post-deposition etching process.

SUMMARY

The present application discloses various embodiments of improved performance optically coated semiconductor devices and various methods for the manufacture thereof. Unlike prior art devices, the devices disclosed herein include a semiconductor wafer or body having a low density, low index of refraction first layer, and a multi-layer optical coating applied thereto. In one embodiment, the multi-layer optical coating comprises alternating layers of a low density, low index of refraction optical material and high density, high index of refraction optical material. Unlike prior art devices, the inclusion of low density, low index of refraction materials in cooperation with high density, high index of refraction materials provides an optical coated semiconductor device which may undergo further processes without degrading the performance characteristics thereof.

In one embodiment, the present application is directed to a method of manufacturing an optically coated semiconductor device and includes depositing a first layer of a low density, low index of refraction material on a surface of a semiconductor device, depositing a multi-layer optical coating comprising alternating layers of low density, low index of refraction materials and high density, high index of refraction materials on the coated surface of the semiconductor device, selectively ablating a portion of the alternating multi-layer optical coating to expose at least a portion of the low density first layer, and selectively ablating a portion of the first layer of low density material to expose at least a portion of the semiconductor device.

In another embodiment, present application is directed to a method of manufacturing an optically coated semiconductor device and includes depositing a first layer of a low density, low index of refraction material on a surface of a semiconductor device, depositing a multi-layer optical coating comprising alternating layers of low density, low index of refraction materials and high density, high index of refraction materials on the coated surface of the semiconductor device, selectively ablating a portion of the alternating multi-layer optical coating using a physical ablation process to expose at least a portion of the low density first layer, and selectively ablating a portion of the first layer of low density material using a controlled chemical etching process to expose at least a portion of the semiconductor device.

In another embodiment, the present application is directed to a semiconductor device having an optical coating selectively applied thereto and includes at least one semiconductor wafer having at least a first surface, a first layer of low density, low index of refraction optical material applied to at least the first surface of the semiconductor wafer, a multi-layer optical coating applied to the first layer of low density, low index of refraction material, the multi-layer optical coating comprising alternating layers of low density, low index of refraction materials and high density, high index of refraction materials.

Other features and advantages of the embodiments of the improved performance optically coated semiconductor devices as disclosed herein will become apparent from a consideration of the following detailed description.

BRIEF DESCRIPTION OF THE DRAWINGS

Various improved performance optically coated semiconductor devices will be explained in more detail by way of the accompanying drawings, wherein.

DETAILED DESCRIPTION

Figure 7:
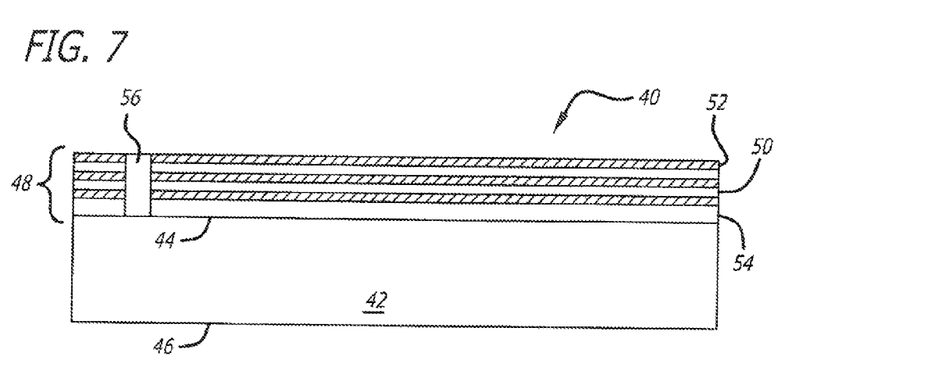
FIG. 7 shows a side view of an embodiment of an improved semiconductor device having a device body with a first layer of low density, low index of refraction material applied thereto, and a multi-layer optical coating applied to the first layer.

FIG. 7 shows an embodiment of an improved performance semiconductor device. As shown, the semiconductor device 40 includes at least one semiconductor device body 42 having at least one multilayered optical coating 48 applied thereto. For example, in one embodiment the semiconductor device 40 comprises a single detector chip or device configured to detect an optical signal at a desired wavelength. In an alternate embodiment, the semiconductor device 40 comprises multiple detector chips, devices, or regions formed on a semiconductor substrate (See FIGS. 8 and 9). In the illustrate embodiment, the optical coating 48 is applied to a first surface 44 of the device body 42. Optionally, the coating 48 may be applied to multiple surfaces of the device body 42. For example, the optical coating 48 may be selectively applied to the first surface 44, the second surface 46, and/or both surfaces 44, 46 of the device body 42.

Referring again to FIG. 7, in one embodiment the optical coating 48 comprises two or more alternating layers of materials having a low index of refraction 50 (hereinafter low index materials) and materials having a high index of refraction 52 (hereinafter high index materials). For example, the low index material layer 50 may comprise silicon dioxide. In another embodiment, the low index material layer 50 may comprise aluminum oxide, silicon monoxide, magnesium fluoride, or thorium fluoride. Similarly, a variety of materials may be used to form one or more of the high index layers 52 of the multilayer coating 48. For example, in one embodiment the high index material layers 52 may comprise niobium dioxide. Optionally, any variety of high index material layers 52 may be used, including, without limitation, titanium dioxide, tantalum pentoxide, hafnium dioxide, zirconium dioxide, aluminum nitride, zinc sulfide, or zinc selenide. During use, the multilayered coating 48 is configured transmit light having a desired optical characteristic therethrough. In one embodiment, the coating 48 may be configured to transmit light having a desired wavelength therethough. For example, the coating 48 may be configured to transmit light having a wavelength between about 475 nm and about 575 nm therethrough. Optionally, the coating 48 may be configured to transmit only light having a desired polarization therethrough.

Unlike prior art devices, the low index layers 50 may be deposited on to the semiconductor body 48 using coating methods such as resistive-source evaporation or conventional electron-beam deposition that achieve low-stress, low-density, porous columnar film structures. In one embodiment, the columnar-structured low-index layers 50 are configured to easily and quickly chemically etched. For example, the low index material layers 50 may be etched using standard non-damaging hydrofluoric acid processes. These low index layers 50, in themselves, may not provide the required hermetic-sealing (e.g. non-moisture absorbing) properties needed for the final optical film structure. Rather, subsequently applied high index layers material layers 52 deposited onto the device body 42 using proven methods such as magnetron sputtering, ion-beam sputtering, cathodic-arc deposition, ion-assisted electron-beam deposition, or ion-plating provide the required high film densities capable of providing hermetic sealing. Therefore, the alternating structure of porous, low-density, low-stress low index material layers 50 together with encapsulating highly densified, high index material layers 52 provides a final optical coating 48 that fully prevents deleterious moisture absorption. Further, the highly densified high index material layers 52 may be configured to be etched using high-energy physical methods of removal such as ion beam milling or reactive ion etching. Moreover, the inclusion of the low density low index material layers 50 has intrinsically very low stress. As such, the combination of low density low index material layers 50 and highly densified high index material layers 50, 52, respectively, has significantly lower stress as compared to current-art deposition methods which rely on highly densified low and high index materials. In one embodiment, the individual film thicknesses of both the low and high index layers 50, 52 are within the range of about 10 nm to about 1000 nm Optionally, either the high or low index films 50, 52 may have the alternating high and low physical densities, the goal being the net reduction in overall optical coating stress.

During manufacture, to prevent typical damage to the sensitive underlying semiconductor surface, a first layer 54 of a low density, low index material may be deposited on the sensitive surface of the semiconductor body 42. This first layer 54 may have a thickness of about 150 nm to about 800 nm. For example, the first layer 54 may have a thickness of about >200 nm. Thereafter, multiple alternating layers of low index materials 50 and high index materials 52 may be selectively applied thereto. Once the multiple layers of low and high index materials 50, 52 are applied, the optically coated device 40 may be further processed using a combination of chemical processing (e.g. hydrofluoric acid) and/or physical processing (e.g. ion beam milling) until this first layer 54 and/or semiconductor body 42 is exposed. If needed, the first layer 54 may be further processed using a non-damaging, gentle, controlled chemical etching process. Due to its low-density structure, the first layer 54 etches easily with the required geometric precision demanded without any risk of damage to the sensitive underlying semiconductor surface. If desired, subsequent device processing (after the desired section of coating is fully removed), may include application of additional filter layers, forming discreet filtering sections within the multiple layer coating (SEE FIG. 9), and/or the deposition of a conductor device 56 (e.g. aluminum, titanium/gold, etc) used for electrically coupling the semiconductor device 40 to an energy source (as for an LED) or to an outside electrical circuit (as for a detector).

Figure 8:
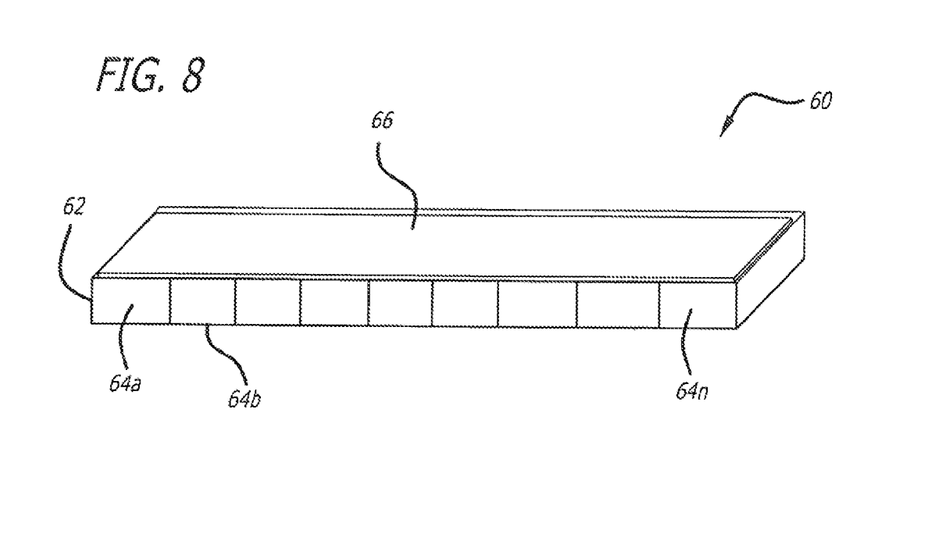
FIG. 8 shows a perspective view of an alternate embodiment of semiconductor device having multiple detector regions formed thereon.
Figure 9:
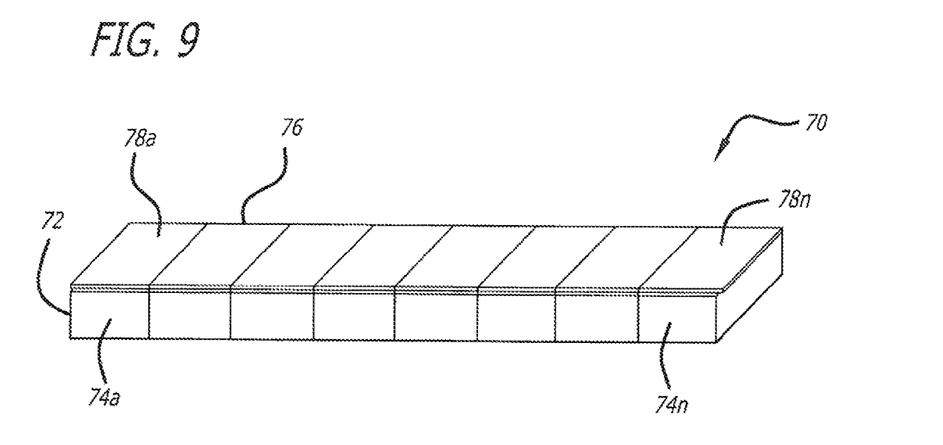
FIG. 9 shows a perspective view of another embodiment of semiconductor device having multiple detector regions formed thereon.

FIGS. 8 and 9 show alternate embodiment of the semiconductor device shown in FIG. 7. As stated above, the semiconductor device may comprise a single detector device or multiple detector devices. For example, FIG. 8 shows an embodiment of a multiple detector semiconductor device 60 having a body 62 defining multiple detector regions 64a-64n. For example, each detector may be configured to detect optical radiation at the same wavelength or different wavelengths. For example, detector region 64a may be configured to detect radiation having a wavelength between about 400 nm and about 450 nm, while detector region 64b is configured to detect radiation having a wavelength of about 450 nm to about 500 nm. Referring again to FIG. 8, a multiple layer optical filter coating 66 as described above may be uniformly applied to the semiconductor device 60. The multiple layer coating 66 may be configured to reflect radiation having a wavelength greater than or less than radiation at a predetermined wavelength range.

FIG. 9 shows an alternate embodiment of a multiple detector semiconductor device. Like the previous embodiment, the semiconductor device 70 includes a body 72 defining multiple detector regions 74a-74n. In contrast to the previous embodiment, the multiple layer coating 76 formed as described above defines multiple filtering regions 78a-78n. Each filtering region 78a-78n may correspond to a specific detector region 74a-74n. As such, each filtering region 78a-78n may be configured to selectively filter radiation within prescribed wavelength range. In one embodiment, the filtering regions 78a-78n may be formed be by controllable varying the number, density, composition, and/or thickness of the various layers forming the multiple layer optical filter coating.

EXAMPLE

An exemplary device was constructed using the process described above. In this embodiment, a multilayer optical coating was applied directly onto a silicon wafer (having photovoltaic devices processed onto its surface). The multilayer optical coating was configured to filter the incident light energy by transmitting a desired spectral band and rejecting light outside of this region. As such, only light within the spectral band 600 nm+/−5 nm was transmitted through the optical coating and subsequently detected by the semiconductor device. The physical characteristics of the coatings are as follows:

SILICON WAFER/220L 49.59H 114.91L (64.18H 209.35L 64.18H 104.68L)7 128.35H 104.68L 64.18H 104.68L 64.18H 104.68L 256.7H 104.68L 64.18H 104.68L 64.18H 104.68L 64.18H 104.68L 64.18H 104.68L 385.06H 104.68L 64.18H 104.68L 64.18H 104.68L 64.18H 104.68L 64.18H 104.68L 256.7H 104.68L 64.18H 104.68L 64.18H 104.68L 112.28H 72.02L/AIR

Where the symbols L and H signify the physical thicknesses (in nm) of L (low index) and H (high index) thin films. The low index material comprised silicon dioxide, while the high index material comprised niobium dioxide.

Figure 10:
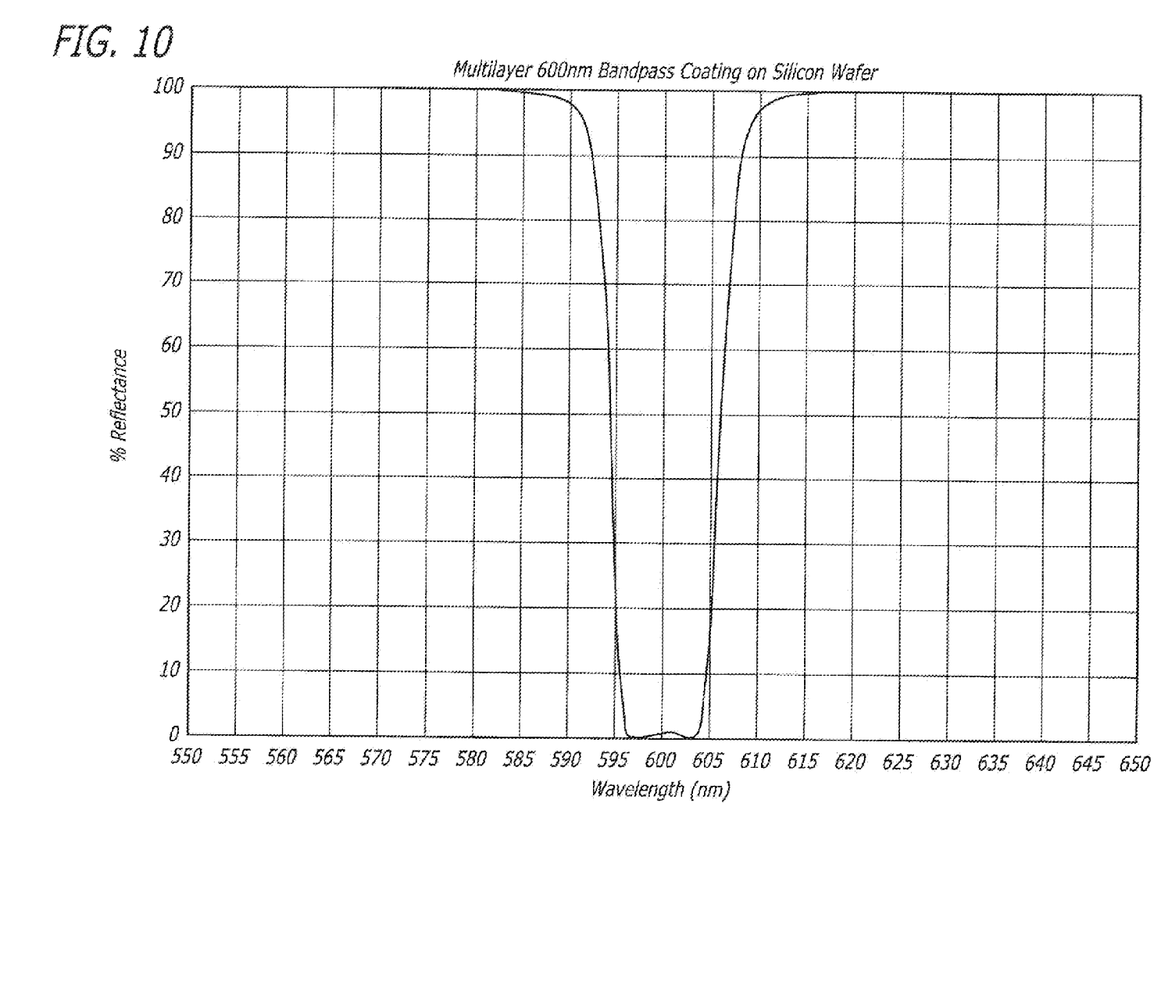
FIG. 10 shows graphically the reflectance characteristics of the optical coating applied to an exemplary semiconductor device manufactured using the processes disclosed herein.
Figure 11:
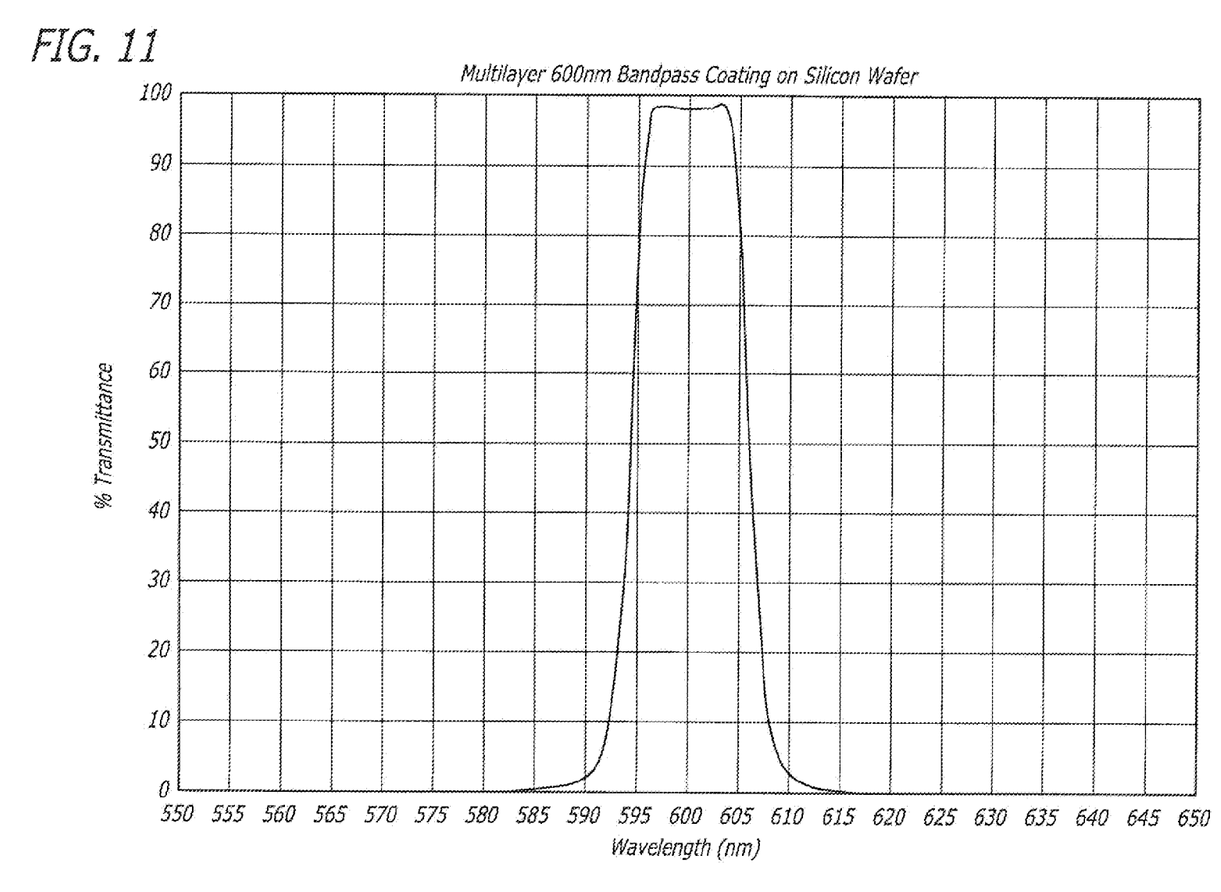
FIG. 11 shows the transmittance of the optical coating applied to an exemplary semiconductor device manufactured using the processes disclosed herein.

FIG. 10 shows graphically the reflectance characteristics of the optical coating applied to the exemplary device, while FIG. 11 shows the transmittance of the optical coating applied to the exemplary device.

In this example, the layers designated "L" are low-density, porous silicon dioxide films deposited by conventional physical vapor deposition methods (electron beam evaporated silicon dioxide or oxygen-plasma converted silicon monoxide evaporated by a resistive source). The first layer is of a thickness of 220 nm, which allows for the subsequent final device processing etching step using hydrofluoric acid. Encapsulating alternating high-density, high index H films are deposited by plasma-assisted magnetron sputtering (niobium dioxide). As illustrated in FIG. 7, the complete optical coating is etched in selected areas for contact metallization using the aforementioned methods. The final spectral responsivity of the optically coated silicon photo detector is illustrated in FIG. 11.

With regard to the above detailed description, like reference numerals used therein refer to like elements that may have the same or similar dimensions, materials and configurations. While particular forms of embodiments have been illustrated and described, it will be apparent that various modifications can be made without departing from the spirit and scope of the embodiments of the invention. Accordingly, it is not intended that the invention be limited by the forgoing detailed description.

What is claimed is:

1. A semiconductor device having an optical coating selectively applied thereto, comprising:
    at least one semiconductor wafer having at least a first surface:
    at least one low-stress-low density porous columnar film layer formed of at least one low density, low index of refraction optical material applied to at least the first surface of the semiconductor wafer;
    a multi-layer optical coating applied to the first layer of low density, low index of refraction material, the multi-layer optical coating comprising alternating layers of low density, low index of refraction materials and high density high index of refraction materials.

2. The device of claim 1 wherein the low density, low index of refraction material comprises silicon dioxide.

3. The device of claim 1 wherein the low density, low index of refraction material comprises at least one material selected from the group consisting of aluminum oxide, silicon monoxide, magnesium fluoride, and thorium fluoride.

4. The device of claim 1 wherein the high density, high index of refraction material comprises niobium dioxide.

5. The device of claim 1 wherein the high density, high index of refraction material comprises at least one material selected from the group consisting of titanium dioxide, tantalum pentoxide, hafnium dioxide, zirconium dioxide, aluminum nitride, zinc sulfide, and zinc selenide.

6. The device of claim 1 wherein the semiconductor wafer defines one or more discreet semiconductor devices.

7. The device of claim 6 wherein the semiconductor devices comprises one or more optical detectors.

8. The device of claim 1 wherein the first layer has a thickness of about 150 nm to about 800 nm.

9. The device of claim 1 wherein the layers forming the multi-layer optical coating have a thickness of about 10 nm to about 1000 nm.

\* \* \* \* \*